(12) United States Patent
Pandey

(10) Patent No.: US 11,961,901 B2
(45) Date of Patent: Apr. 16, 2024

(54) BIPOLAR TRANSISTOR STRUCTURE WITH BASE PROTRUDING FROM EMITTER/COLLECTOR AND METHODS TO FORM SAME

(71) Applicant: GlobalFoundries U.S. Inc., Malta, NY (US)

(72) Inventor: Shesh Mani Pandey, Saratoga Springs, NY (US)

(73) Assignee: GlobalFoundries U.S. Inc., Malta, NY (US)

(*) Notice: Subject to any disclaimer, the term of this patent is extended or adjusted under 35 U.S.C. 154(b) by 70 days.

(21) Appl. No.: 17/659,357

(22) Filed: Apr. 15, 2022

(65) Prior Publication Data

US 2023/0178637 A1    Jun. 8, 2023

Related U.S. Application Data

(60) Provisional application No. 63/265,110, filed on Dec. 8, 2021.

(51) Int. Cl.
*H01L 29/735* (2006.01)
*H01L 29/08* (2006.01)
(Continued)

(52) U.S. Cl.
CPC ........ *H01L 29/735* (2013.01); *H01L 29/0808* (2013.01); *H01L 29/0821* (2013.01); *H01L 29/1008* (2013.01); *H01L 29/6625* (2013.01)

(58) Field of Classification Search
CPC ............... H01L 29/735; H01L 29/0808; H01L 29/0821; H01L 29/1008; H01L 29/6625; H01L 29/7317; H01L 29/66265; H01L 29/732; H01L 29/063; H01L 29/0649; H01L 29/6656; H01L 29/0673; H01L 29/0847; H01L 29/66439; H01L 29/66484; H01L 29/66886; H01L 29/7831;
(Continued)

(56) References Cited

U.S. PATENT DOCUMENTS 6,246,104 B1    6/2001    Tsuda et al.
9,318,585 B1 *  4/2016    Cai .................. H01L 29/737
(Continued)

OTHER PUBLICATIONS

European Search Report for corresponding EP Application No. 22201488.8-1212 dated Apr. 20, 2023, 10 pages.

*Primary Examiner* — Natalia A Gondarenko
(74) *Attorney, Agent, or Firm* — Francois Pagette; Hoffman Warnick LLC

(57) ABSTRACT

The disclosure provides a bipolar transistor structure with multiple bases, and related methods. A bipolar transistor structure includes a first emitter/collector (E/C) material above an insulator. The first E/C material has first sidewall and a second sidewall over the insulator. A first base is above the insulator adjacent the first sidewall of the first E/C material. A second base is above the insulator adjacent the second sidewall of the first E/C material. A second E/C material is above the insulator and adjacent the first base. A width of the first base between the first E/C material and the second E/C material is less than a width of the first E/C material, and the first base protrudes horizontally outward from an end of the first E/C material and an end of the second E/C material.

20 Claims, 12 Drawing Sheets

(51) Int. Cl.
*H01L 29/10* (2006.01)
*H01L 29/66* (2006.01)

(58) Field of Classification Search
CPC ........... H01L 29/7832; H01L 29/78645; H01L 29/78648; H01L 29/775; H01L 29/78696; H01L 29/42392; H01L 29/36; H01L 21/82285; H01L 21/823821; H01L 27/0623; H01L 27/0823; H01L 27/0886; H01L 27/0924; H01L 27/10879; H01L 27/1211; H01L 27/1251; H01L 21/76897; H01L 21/823431; H01L 21/823468; H01L 21/823475; H01L 21/823493; H01L 21/82345; H01L 21/82385; H01L 21/823842
USPC .......... 257/565, 306, 133, 368, 586, 29.198, 257/21.383, 27.015
See application file for complete search history.

(56) References Cited

U.S. PATENT DOCUMENTS

| | | |
|---|---|---|
| 9,502,504 B2 | 11/2016 | Cai et al. |
| 9,647,553 B2 | 5/2017 | Alexander et al. |
| 9,748,369 B2 | 8/2017 | Liu |
| 2010/0289028 A1 | 11/2010 | Kawachi |
| 2011/0018608 A1* | 1/2011 | Chi ..................... H01L 29/0808 257/E29.171 |
| 2018/0061853 A1 | 3/2018 | Valdes Garcia et al. |
| 2018/0269289 A1* | 9/2018 | Balakrishnan ........ H01L 29/735 |
| 2018/0277666 A1* | 9/2018 | Chu ..................... H01L 29/0657 |
| 2021/0242335 A1 | 8/2021 | Singh et al. |

\* cited by examiner

BIPOLAR TRANSISTOR STRUCTURE WITH BASE PROTRUDING FROM EMITTER/COLLECTOR AND METHODS TO FORM SAME

BACKGROUND

1. Technical Field

The present disclosure provides a bipolar structure with a base protruding from an emitter/collector material and methods to form the same.

2. Background Art

Present technology is at atomic level scaling of certain micro-devices such as logic gates, bipolar transistors, field effect transistors (FETs), and capacitors. Circuit chips with hundreds of millions of such devices are common. The structure of a lateral bipolar transistor defines several of its properties during operation. Conventional integrated circuits may employ bipolar transistors of various compositions and configurations, e.g., vertical bipolar transistors. Some of these devices may have higher costs and/or operational parameters that do not meet certain constraints. Such parameters may include, e.g., the need to form a base of sufficient width for operability in a lateral bipolar transistor.

SUMMARY

The illustrative aspects of the present disclosure are designed to solve the problems herein described and/or other problems not discussed.

Embodiments of the disclosure provide a bipolar transistor structure including: a first emitter/collector (E/C) material above an insulator, the first E/C material having a first sidewall and a second sidewall over the insulator; a first base on the insulator adjacent the first sidewall of the first E/C material; a second base above the insulator adjacent the second sidewall of the first E/C material; and a second E/C material above the insulator and adjacent the first base, wherein a width of the first base between the first E/C material and the second E/C material is less than a width of the first E/C material, and the first base protrudes horizontally outward from an end of the first E/C material and an end of the second E/C material.

Another embodiment of the disclosure provides a bipolar transistor structure including: a first emitter/collector (E/C) material above an insulator, the first E/C material having a first sidewall over the insulator and a second sidewall opposite the first sidewall and over the insulator; a first base above the insulator adjacent the first sidewall of the first E/C material; a second base above the insulator adjacent the second sidewall of the first E/C material; a second E/C material above the insulator and adjacent the first base, wherein a width of the first base between the first E/C material and the second E/C material is less than a width of the first E/C material, wherein the first base protrudes horizontally outward from an end of the first E/C material and an end of the second E/C material; and a third E/C material above the insulator and adjacent the second base, wherein a width of the second base between the first E/C material and the third E/C material is less than a width of the first E/C material, and the second base protrudes horizontally outward from an end of the first E/C material and an end of the third E/C material.

Further embodiments of the disclosure provide a method of forming a bipolar transistor structure, the method including: forming a first emitter/collector (E/C) material above an insulator, the first E/C material having a first sidewall and a second sidewall over the insulator; forming a first base above the insulator adjacent the first sidewall of the first E/C material; forming a second base above the insulator adjacent the second sidewall of the first E/C material; and forming a second E/C material above the insulator and adjacent the first base, wherein a width of the first base between the first E/C material and the second E/C material is less than a width of the first E/C material, and the first base protrudes horizontally outward from an end of the first E/C material and an end of the second E/C material.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
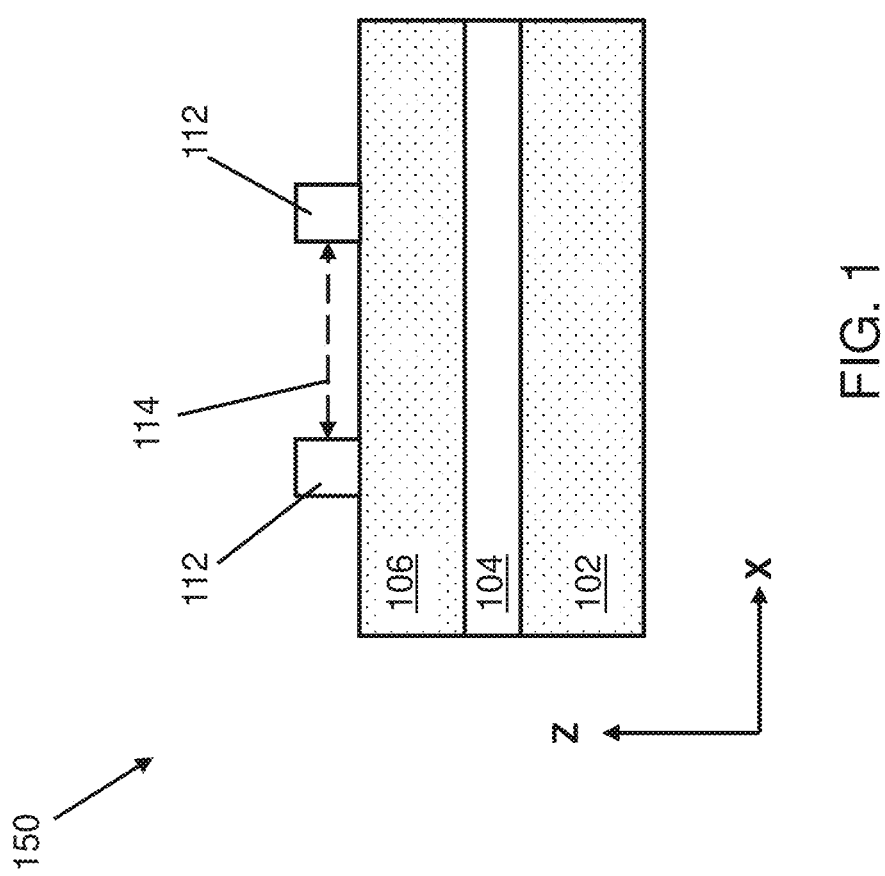
FIG. 1 depicts an initial structure with insulative caps according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described to best explain the principles of the disclosure and the practical application, and to enable others of ordinary skill in the art to understand the disclosure for various embodiments with various modifications as are suited to the particular use contemplated.

Embodiments of the disclosure include a bipolar transistor structure with multiple bases, e.g., first and second bases, one or more of which may horizontally protrude from an end (e.g., a sidewall) of an adjacent emitter or collector. Related methods to form a bipolar transistor structure are also disclosed. A bipolar transistor structure may include a first emitter/collector (E/C) material on an insulator. The first E/C material may have first and second sidewalls over the insulator. A first base of opposite doping polarity with respect to the first E/C material may be on the insulator and adjacent the first sidewall of the first E/C material. A second base, also of opposite doping polarity with respect to the first E/C material, may be on the insulator and adjacent the second sidewall of the first E/C material. A second E/C material may be on the insulator and may be adjacent the first base. A width of the first base between the first E/C material and the second E/C material may be less than a width of the first E/C material, and the first base may protrude horizontally outward from an end of the first E/C material and an end of the second E/C material.

In some cases, a third E/C material also may be on the insulator and may be adjacent the second base. In this configuration, the first E/C material may be adjacent the first base on one horizontal end and adjacent the second base on another horizontal end, to be horizontally between the second and third E/C materials. An isolation region such as an inter-level dielectric (ILD) material may be on the insulator and may surround each part of the bipolar transistor structure. The bipolar transistor structure, moreover, may be formable from a semiconductor on insulator (SOI) layer.

Bipolar junction transistor (BJT) structures, such as those in embodiments of the current disclosure, operate using multiple "P-N junctions." The term "P-N" refers to two adjacent materials having different types of conductivity (i.e., P-type and N-type), which may be induced through dopants within the adjacent material(s). A P-N junction, when formed in a device, may operate as a diode. A diode is a two-terminal element, which behaves differently from conductive or insulative materials between two points of electrical contact. Specifically, a diode provides high conductivity from one contact to the other in one voltage bias direction (i.e., the "forward" direction), but provides little to no conductivity in the opposite direction (i.e., the "reverse" direction). In the case of the P-N junction, the orientation of a diode's forward and reverse directions may be contingent on the type and magnitude of bias applied to the material composition of one or both terminals, which affect the size of the potential barrier. In the case of a junction between two semiconductor materials, the potential barrier will be formed along the interface between the two semiconductor materials.

Referring to FIG. 1, an initial structure 100 (simply "structure" hereafter) suitable to form a vertical bipolar transistor structure, according to embodiments of the disclosure, is shown. Initial structure 100 may be processed as described herein to yield one or more vertical bipolar transistor structures. However, it is understood that other techniques, ordering of processes, etc., may be implemented to yield the same bipolar transistor structure(s) or similar bipolar transistor structures in further embodiments. FIG. 1 shows a cross-sectional view of structure 100 with a substrate 102 including, e.g., one or more semiconductor materials. Substrate 102 may include but is not limited to silicon, germanium, silicon germanium (SiGe), silicon carbide, or any other common integrated circuit (IC) semiconductor substrates. In the case of SiGe, the germanium concentration in substrate 102 may differ from other SiGe-based structures described herein. A portion or entirety of substrate 102 may be strained.

Initial structure 100 includes embedded elements for electrically separating active materials formed thereon from other regions and/or materials from substrate 102. A buried insulator layer 104 may be formed over substrate 102, e.g., by forming one or more insulative materials on doped semiconductor well by deposition and/or by otherwise converting pre-existing semiconductor material into an insulative substance. Buried insulator layer 104 may extend horizontally over substrate 102, and/or may be located under locations where active materials are formed, examples of which are discussed elsewhere herein. Buried insulator layer 104 may include oxygen doping to form a dielectric insulator or a buried oxide ("BOX") layer above substrate 102 and electrically isolate overlying active semiconductor materials. Buried insulator layer 104 may include other elements or molecules such as Ge, N, or Si. Buried insulator layer 104 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

Initial structure 100 may include a semiconductor on insulator (SOI) layer 106 above buried insulator layer 104. SOI layer 106 may include, e.g., SiGe or any other semiconductor material that is doped to have a predetermined polarity. SOI layer 106 may extend to a predetermined height over buried insulator layer 104. SOI layer 106 may include the same material as substrate 102 and/or similar semiconductor materials. Selected portions of SOI layer 106 can be doped by any known process and/or to any desired polarity by introducing dopants into SOI layer 106, e.g., by implantation and/or any other conceivable process to introduce dopant material(s) into a layer of semiconductor material. In an example implementation, SOI layer 106 may be doped P type.

Insulative caps 112 may be formed on structure 100 from an insulative layer (e.g., nitride) formed on a selected portion of SOI layer 106, and a second insulative layer (e.g., oxide) thereon. The shape of the insulator layers may be defined, e.g., by forming a layer of insulative material over all of SOI layer 106 and using a mask (not shown) to remove portions of the insulator where it is not desired. The composition of each insulative layer may be distinct to allow selective removing of one layer without affecting the other layer. Portions of the second insulative layer may be removed by non-selective directional etching (e.g., reactive ion etching (RIE)) to re-expose portions of SOI layer 106 and upper surfaces of SOI layer 106. However, residual vertically-extending portions of the second insulative layer may remain intact on SOI layer 106 and adjacent sidewalls of first insulative layer 108 as insulative caps 112. Insulative caps 112 may remain on SOI layer 106, e.g., due to the vertical etching of second insulative layer 110 not significantly affecting portions that extend vertically above SOI layer 106. Insulative caps 112 may function as a residual mask on SOI layer 106 in subsequent processing. The position of insulative caps 112 may define an opening 114 between insulative caps 112. Within opening 114, an upper surface of SOI layer 106 is exposed. Insulative caps 112, and opening 114 therebetween, may define the position and size of base terminals for a bipolar transistor structure to be formed from SOI layer 106 and above buried insulator layer 104.

Figure 2:
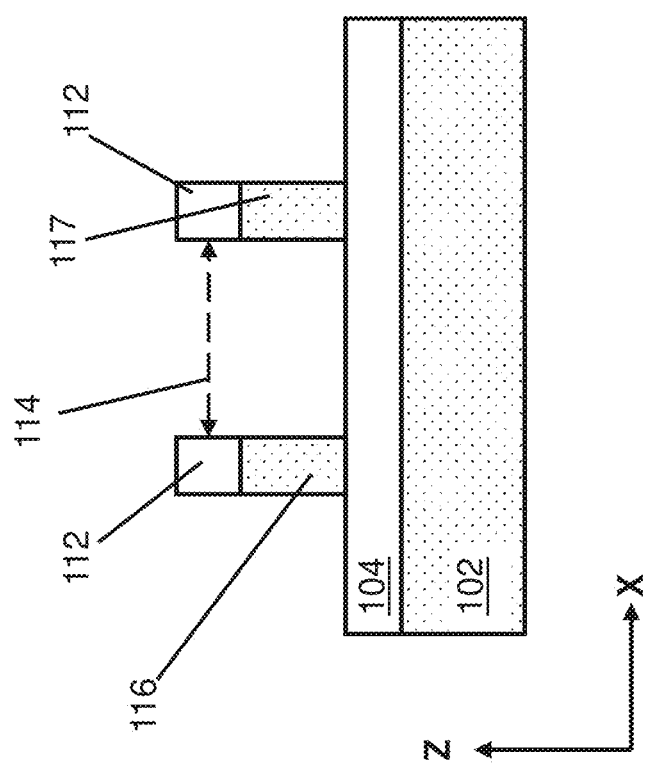
FIG. 2 depicts a cross-sectional view of removing the SOI layer in methods according to the disclosure.

FIG. 2 depicts removing portions of SOI layer 106 (FIG. 1) that are not covered by insulative caps 112, including portions of SOI layer 106 that are below opening 114. The targeted removing of SOI layer 106 may be implemented, e.g., by downward directional etching of semiconductor and/or other processes that may remove SOI layer 106 from buried insulator layer 104 without affecting insulative caps 112 and portions of SOI layer 106. Removing portions of SOI layer 106 not covered by insulative caps 112 may produce a first base 116 and a second base 117 over buried insulator layer 104. Bases 116, 117, despite being formed from the same layer of semiconductor material, may be discontinuous from each other over buried insulator layer 104. In further processing, additional material(s) may be formed to structurally integrate each of bases 116, 117 into one bipolar transistor structure. Since first base 116 and second base 117 are laterally discontinuous from one another over buried insulator layer 104 at this stage of processing, the space defining opening 114 between bases 116, 117 and over buried insulator layer 104 is temporarily empty.

Figure 3:
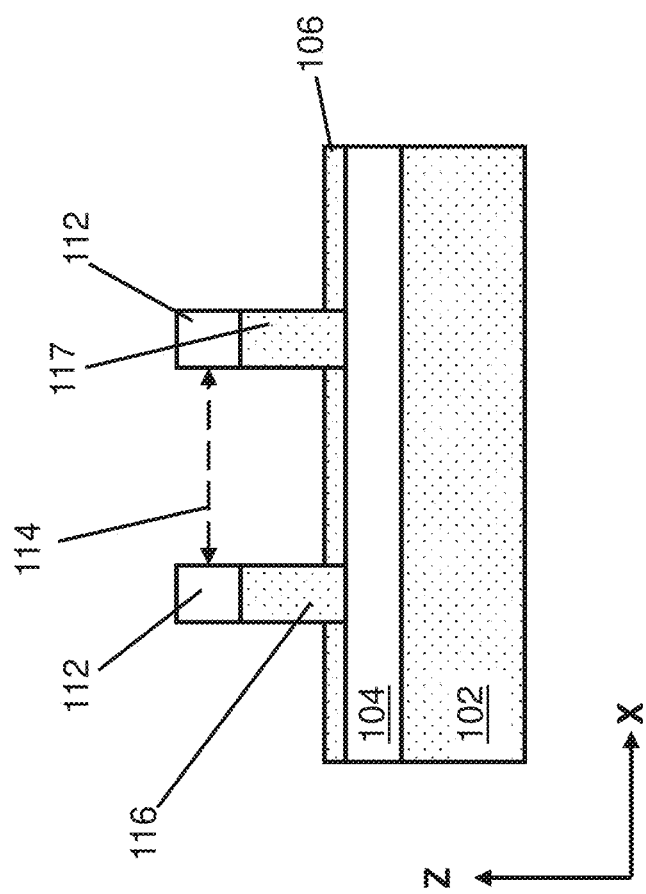
FIG. 3 depicts a cross-sectional view of removing a portion of the SOI layer in methods according to further embodiments of the disclosure.

FIG. 3 depicts an alternative process in which a portion of SOI layer 106 remains above buried insulator layer 104. This configuration may be produced, e.g., by only partially etching or otherwise removing an upper portion of SOI layer 106. In this case, first base 116 and second base 117 may extend vertically above the height of of SOI layer 106. Despite the presence of remaining portions of SOI layer 106, further operations discussed herein may be implemented without otherwise significantly departing from the various technical details and examples discussed herein.

Figure 4:
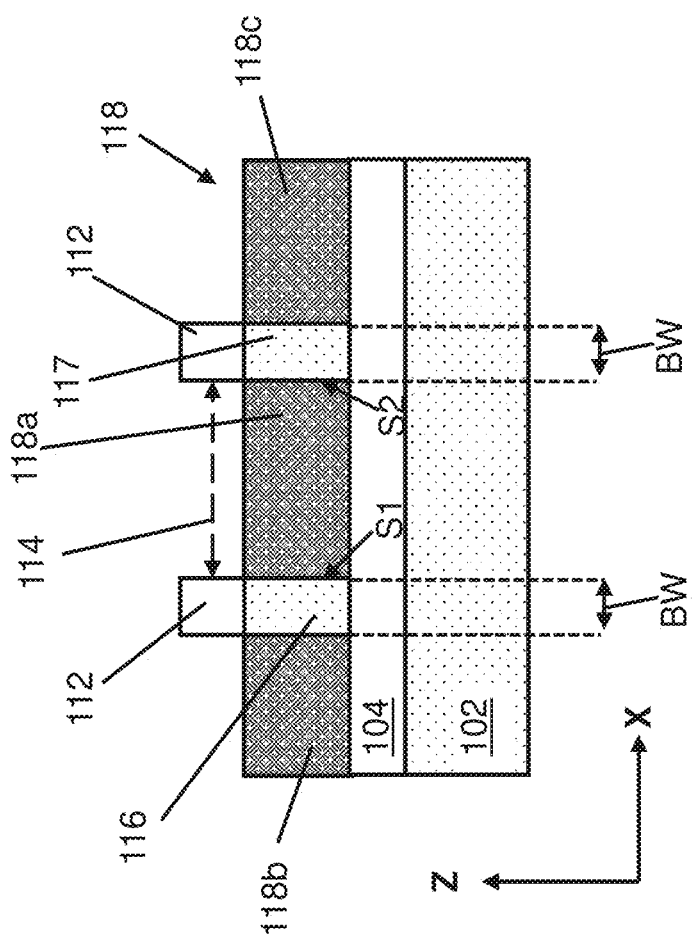
FIG. 4 depicts a cross-sectional view of forming emitter/collector (E/C) materials in methods according to the disclosure.
Figure 5:
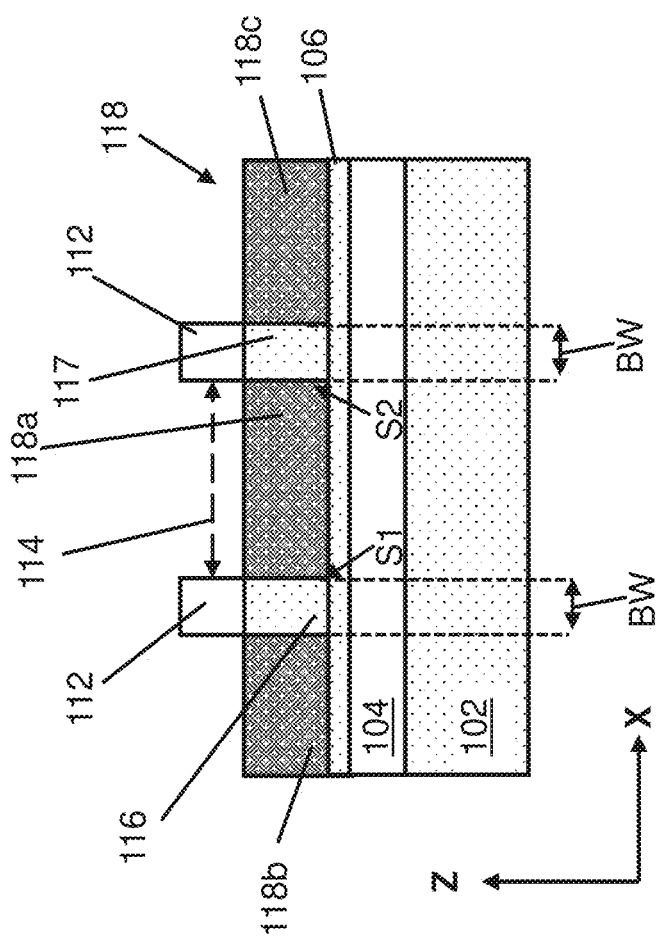
FIG. 5 depicts a cross-sectional view of forming emitter/collector (E/C) materials on a portion of the SOI layer in methods according to further embodiments of the disclosure.

Turning to FIGS. 4 and 5, the forming of a bipolar transistor structure may include forming multiple areas of emitter/collector (E/C) material 118 above buried insulator layer 104 and adjacent base(s) 116, 117. FIG. 4 depicts an implementation in which E/C material 118 is formed on an upper surface of buried insulator layer 104, whereas FIG. 5 depicts an implementation in which E/C material 118 is formed on a remaining portion of SOI layer 106. E/C material 118 may include, e.g., semiconductor materials such as silicon germanium (SiGe) and dopants having an opposite polarity from the doping polarity of bases 116, 117. That is, E/C material 118 may be p-type when bases 116, 117 are doped n-type or vice versa. The forming of E/C material 118 above buried insulator layer 104 and adjacent bases 116, 117 may be implemented, e.g., by depositing a seed layer of semiconductor material above buried insulator layer 104 and epitaxially growing to a desired thickness, e.g., approximately the same thickness as bases 116, 117. E/C material 118 alternatively may be formed by any other currently known or later developed methodologies to form and doped semiconductor material on a layer of insulative material.

The forming of E/C material 118 may produce two or more regions to define respective collector and emitter terminals in a bipolar transistor structure. For example, a first E/C material 118a may be above buried insulator layer 104 and may include at least a first sidewall S1 over buried insulator layer 104 and a second sidewall S2 over buried insulator layer 104. Although sidewalls S1, S2 are shown by example to be at opposing horizontal ends in plane X-Z, this is not necessarily required in all implementations. First sidewall S1 of first E/C material 118a may be adjacent first base 116 and second sidewall S2 of first E/C material 118a may be adjacent second base 117. A second E/C material 118b may be horizontally adjacent first base 116 such that first base 116 is horizontally between E/C materials 118a, 118b. A third E/C material 118c may be horizontally adjacent second base 117 such that second base 117 is horizontally between E/C materials 118a, 118c. The horizontal width of each E/C material 118a, 118b, 118c (i.e., the dimension extending along the X-axis) may be larger than a base width BW of first base 116 and/or second base 117. Thus, each base 116, 117 may have a width that is less than the width of E/C material(s) 118a, 118b, 118c. After E/C material 118 is formed to a desired thickness above buried insulator layer 104, insulative caps 112 may be removed, e.g., by selective etch of the material(s) therein. The resulting arrangement of E/C materials 118a, 118b, 118c and bases 116, 117 may define active components of a bipolar transistor structure according to embodiments of the disclosure.

Figure 6:
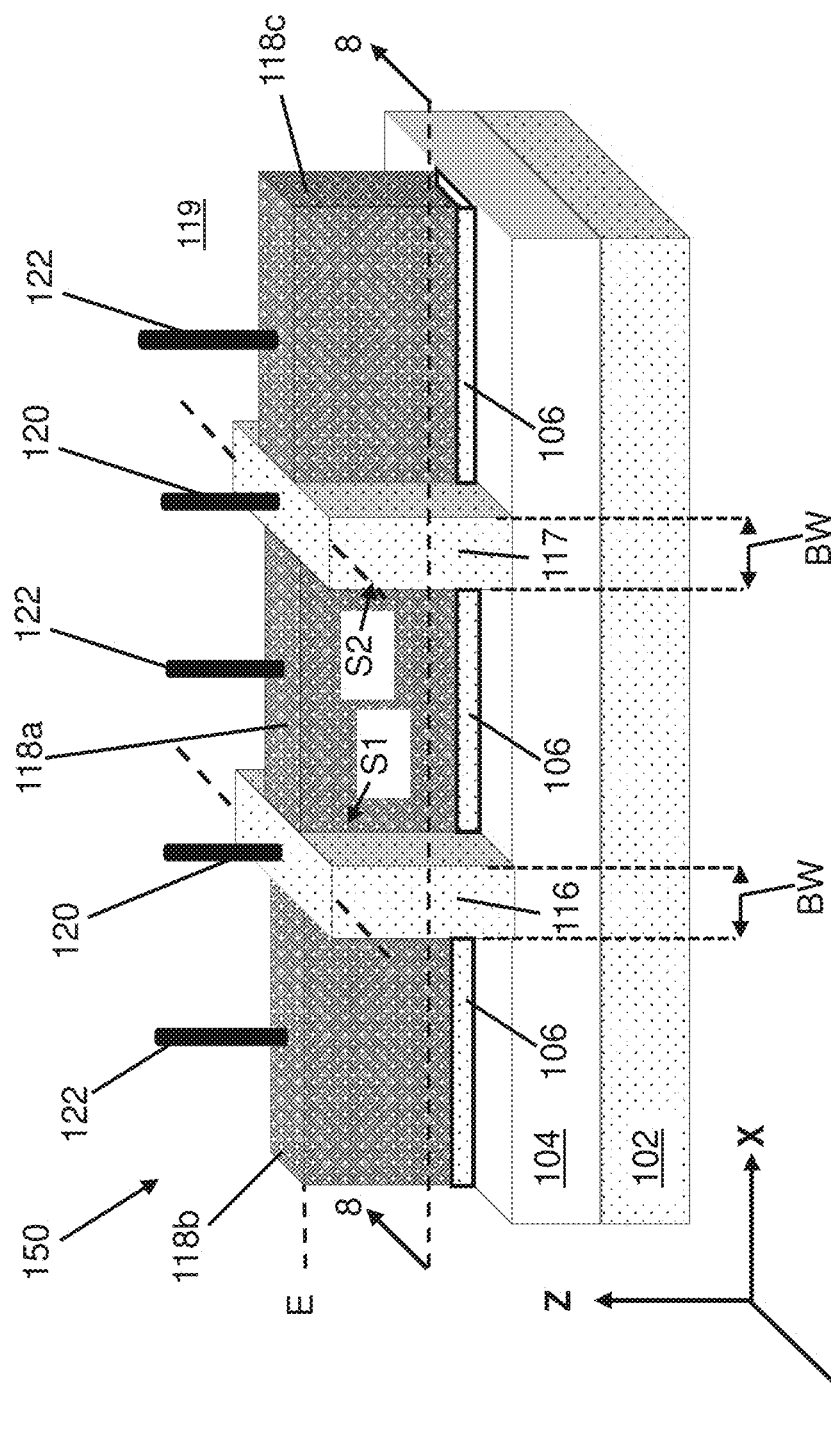
FIG. 6 depicts a perspective view of a bipolar transistor structure with multiple base terminals and a portion of the SOI layer according to embodiments of the disclosure.
Figure 8:
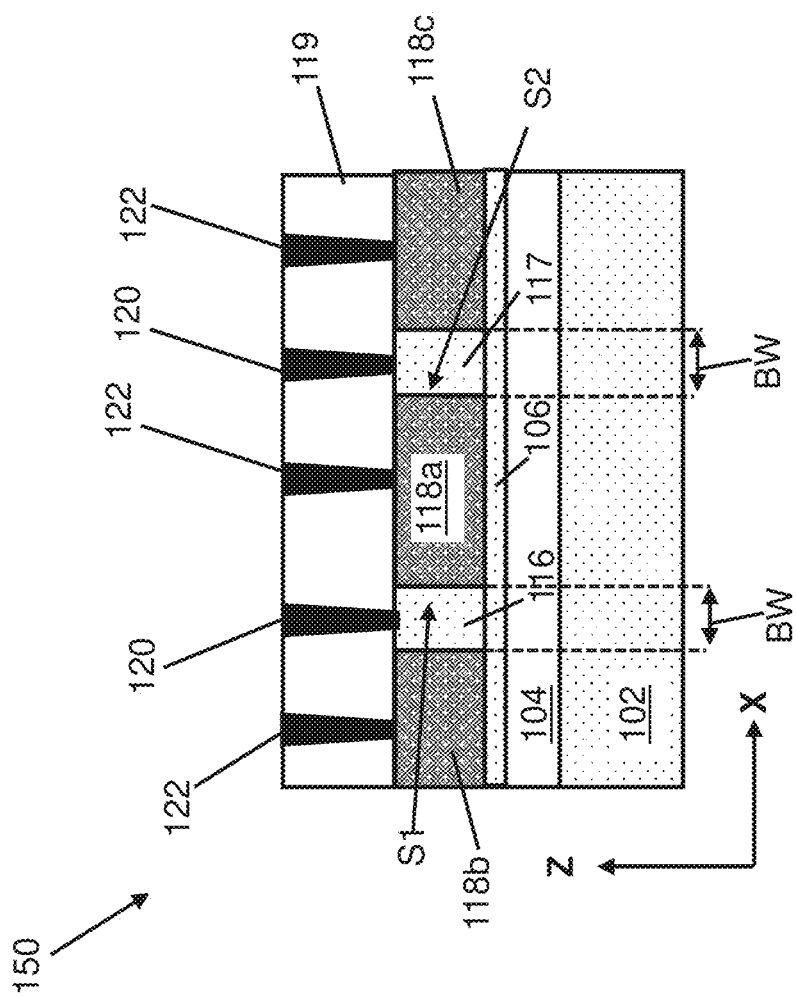
FIG. 8 depicts a cross-sectional view of a bipolar transistor structure with multiple base terminals and a portion of the SOI layer according to further embodiments of the disclosure.

Turning to FIGS. 6 and 8, in which FIG. 6 provides a perspective view and FIG. 8 provides a cross-sectional view along view line 8-8 of FIG. 6, further processes according to the disclosure may form a bipolar transistor structure 150. E/C materials 118a, 118b, 118c and bases 116, 117 may be freestanding, i.e., they may be above the buried insulator layer 104 without being adjacent to any other electrically active components or devices that are also over buried insulator layer 104. In addition, first base 116 and second base 117 each may have a length (i.e., the direction extending in parallel with the Y-axis) that is greater than the length of E/C material(s) 118a, 118b, 118c. Thus, first base 116 and/or second base 117 may extend beyond an edge E of E/C material(s) 118a, 118b, 118c so as to horizontally protrude beyond edge E. Additional portions of first base 116 and second base 117 are shown with dashed lines to note an indeterminate length. E/C materials 118a, 118b, 118c and bases 116, 117 may be adjacent/or and surrounded by subsequently formed insulative materials on which subsequent layers (e.g., various metal wiring layers) are formed.

Figure 7:
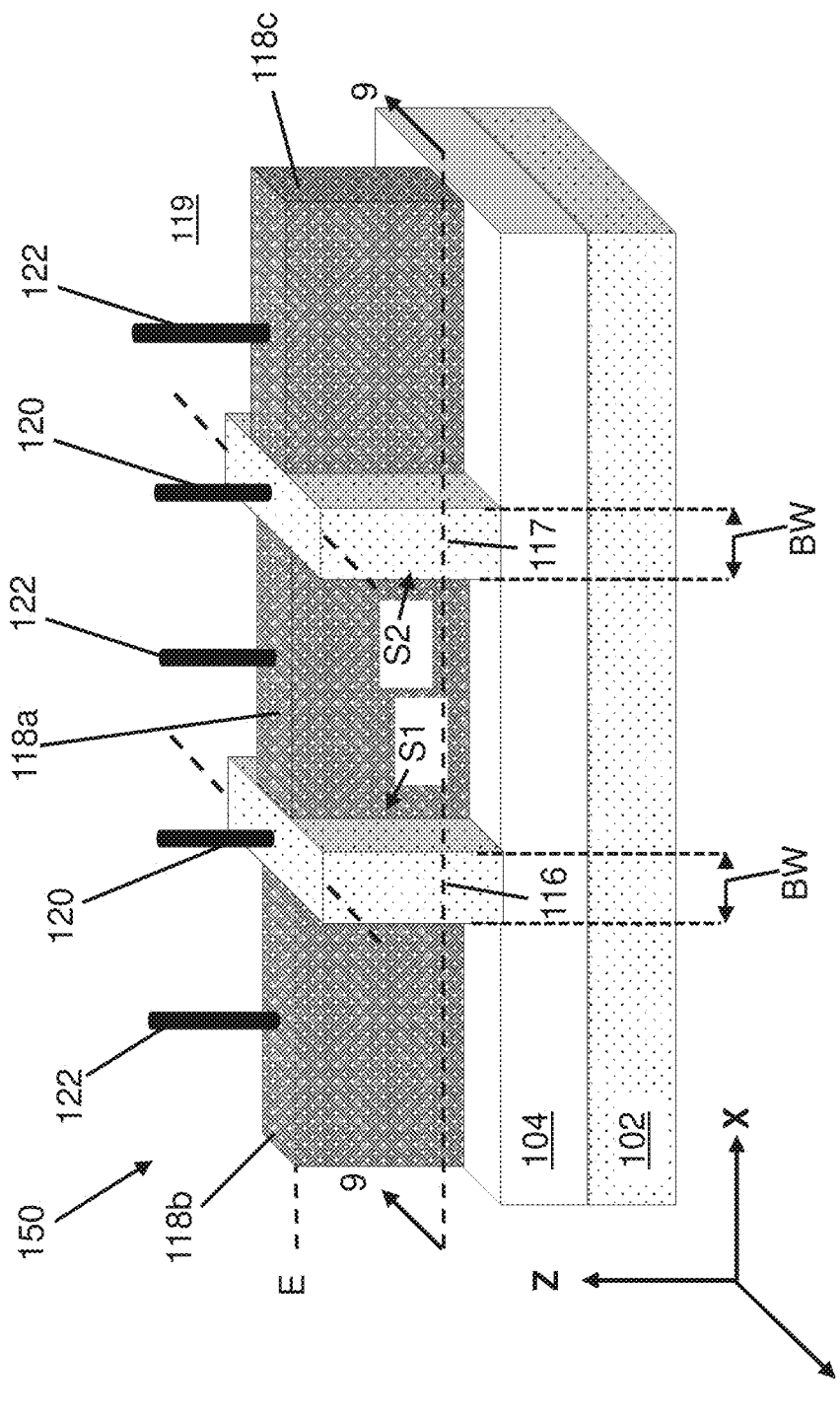
FIG. 7 depicts a perspective view of a bipolar transistor structure with multiple base terminals according to embodiments of the disclosure.
Figure 9:
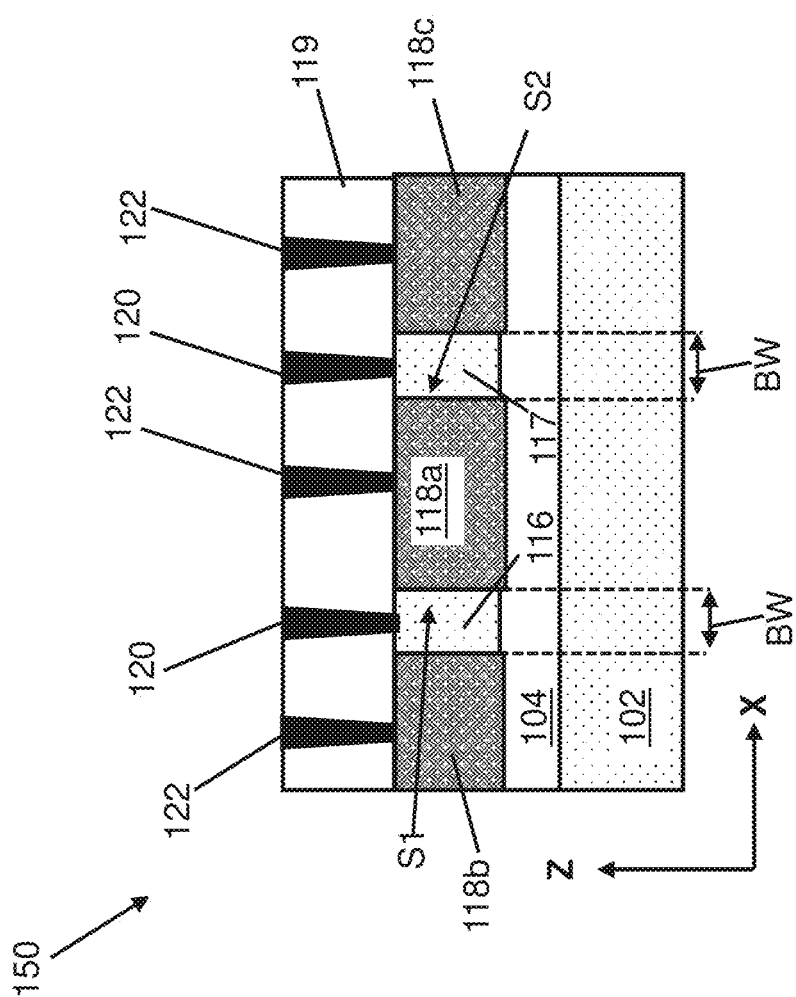
FIG. 9 depicts a cross-sectional view of a bipolar transistor structure with multiple base terminals according to embodiments of the disclosure.

FIGS. 7 and 9 similarly depict perspective and cross-sectional views, respectively, of a bipolar transistor structure 150 without SOI layer 106 (FIGS. 6, 8) included. In all other respects, however, bipolar transistor structure 150 may include some or all of the features illustrated in FIGS. 6 and 8. Thus, E/C materials 118a, 118b, 118c and bases 116, 117 may be freestanding, i.e., they may on an upper surface of buried insulator layer 104 without being adjacent to any other electrically active components or devices that are also over buried insulator layer 104.

FIGS. 6-9 depict the forming of an isolation layer 119 above buried insulator layer 104 by deposition or other techniques of forming an insulative material on a structure. Isolation layer 119, in this position, also may surround E/C materials 118a, 118b, 118c and bases 116, 117 thereon.

Isolation layer 119 may include the same insulating material as buried insulator layer 104 or may include a different electrically insulative material. Isolation layer 119 may include an inter-level dielectric (ILD) material for vertically separating active materials above buried insulator layer 104 from overlying materials, e.g., various horizontally extending wires or vias. Isolation layer 119 and buried insulator layer 104 nonetheless constitute different components, e.g., due to buried insulator layer 104 initially being below SOI layer 106 (FIG. 1). Isolation layer 119 at this stage may indicate only a portion of the eventual isolation layer 119 material to be formed over the bipolar transistor structure. After depositing isolation layer 119, isolation layer 119 can be planarized (e.g., using CMP), but its upper surface may remain above E/C materials 118a, 118b, 118c and bases 116, 117 such that it covers these active materials. In some implementations (not shown), a silicide layer as known in the art could be formed on upper surfaces of E/C materials 118a, 118b, 118c and bases 116, 117 before isolation layer 119 deposition. For example, a Co, Ti, NI, Pt, or similar self-aligned silicide (silicide) could be formed prior to isolation layer 119 formation. Additional metallization layers (not shown) may be formed on isolation layer 119 during middle-of-line and/or back-end-of-line processing.

To electrically couple various components discussed herein to metallization layers, a set of base contacts 120 contacting bases 116, 117 and within isolation layer 119 may be formed. Similarly, a set of E/C contacts 122 may be formed on E/C materials 118a, 118b, 118c and within isolation layer 119. One or more of contacts 120, 122 to overlying circuit elements may be formed within predetermined portions of isolation layer 119 by a controlled amount of vertical etching to form openings to one or more contact sites, and then filling the openings with a conductor. Each contact 120, 122 may include any currently known or later developed conductive material configured for use in an electrical contact, e.g., tungsten (W), copper (Cu), aluminum (Al), etc. Contacts 120, 122 may additionally include refractory metal liners (not shown) positioned alongside isolation layer 119 to prevent electromigration degradation, shorting to other components, etc. As discussed herein, selected portions of E/C materials 118a, 118b, 118c and bases 116, 117 may include silicide regions (i.e., portions of semiconductor that are annealed in the presence of an overlying conductor) to increase the electrical conductivity at their physical interface with contact(s) 120, 122, where applicable. After contacts 120, 122 are formed to form electrical couplings to E/C materials 118a, 118b, 118c and bases 116, 117 from overlying conductive layers, the structure defines a bipolar transistor structure 150.

Figure 10:
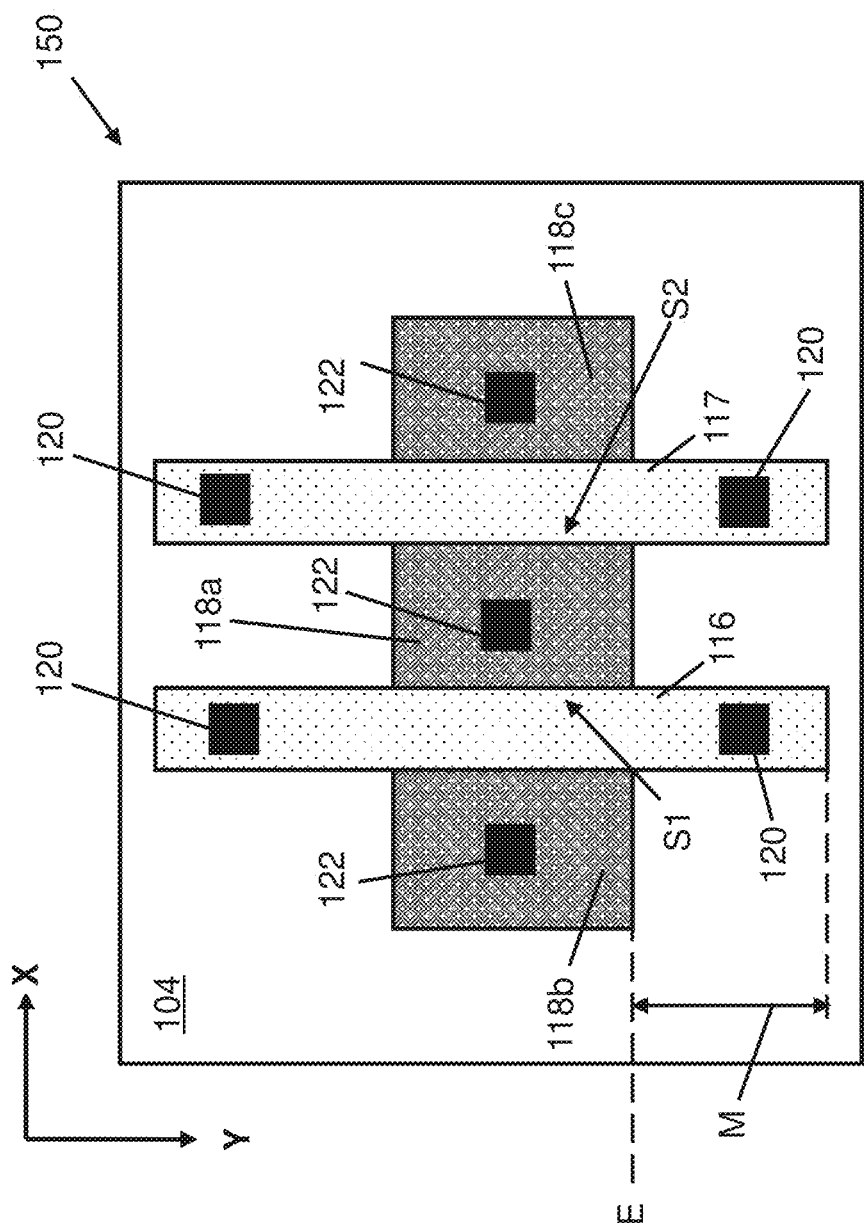
FIG. 10 depicts a plan view of a bipolar transistor structure with multiple base terminals protruding outwardly from emitter/collector materials according to embodiments of the disclosure.

FIG. 10 depicts a plan view of bipolar transistor structure 150 in the X-Y plane according to further embodiments. As discussed elsewhere herein, bipolar transistor structure 150 may be arranged such that first base 116 and second base 117 protrude horizontally outward (e.g., along the Y axis) from edge E of E/C materials 118a, 118b, 118c. Among other benefits, this configuration ensures base contacts 120 are physically separated from E/C contacts 122. In this configuration, first base 116 and/or second base 117 protrude horizontally from edge E of E/C materials 118a, 118b, 118c by a separation distance M. Separation distance M may vary based on technical application and/or the product(s) where bipolar transistor structure 150 is used, and in an example separation distance M may be approximately ten micrometers (μm). In further implementations, separation distance M may vary widely and may for instance may be as small as twenty nanometers (nm) or as large as twenty μm.

Although first base 116 and/or second base 117 may have a thinner width than E/C material(s) 118a, 118b, 118c (e.g., along the X axis as shown) each base 116 and second base 117 may have a greater length and hence a larger lateral surface area than E/C material(s) 118a, 118b, 118c. Specifically, separation distance M may be large enough to cause first base 116 and/or second base 117 to have a larger lateral surface area in plane X-Y than E/C materials 118a, 118b, 118c. In an example implementation, each E/C material 118a, 118b, 118c may have a lateral surface area of approximately 150 μm$^2$ in plane X-Y whereas each base 116, 117 may have a lateral surface area of approximately 200 μm$^2$. This may allow stronger electrical biasing of first base 116 and second base 117 through base contacts 120, despite the smaller horizontal width of each base 116, 117 as compared to E/C materials 118a, 118b, 118c (e.g., along the X axis). In further implementations, however, the lateral surface area of bases 116, 117 may be substantially smaller or larger as compared to the surface area of any E/C materials 118a, 118b, 118c.

Figure 11:
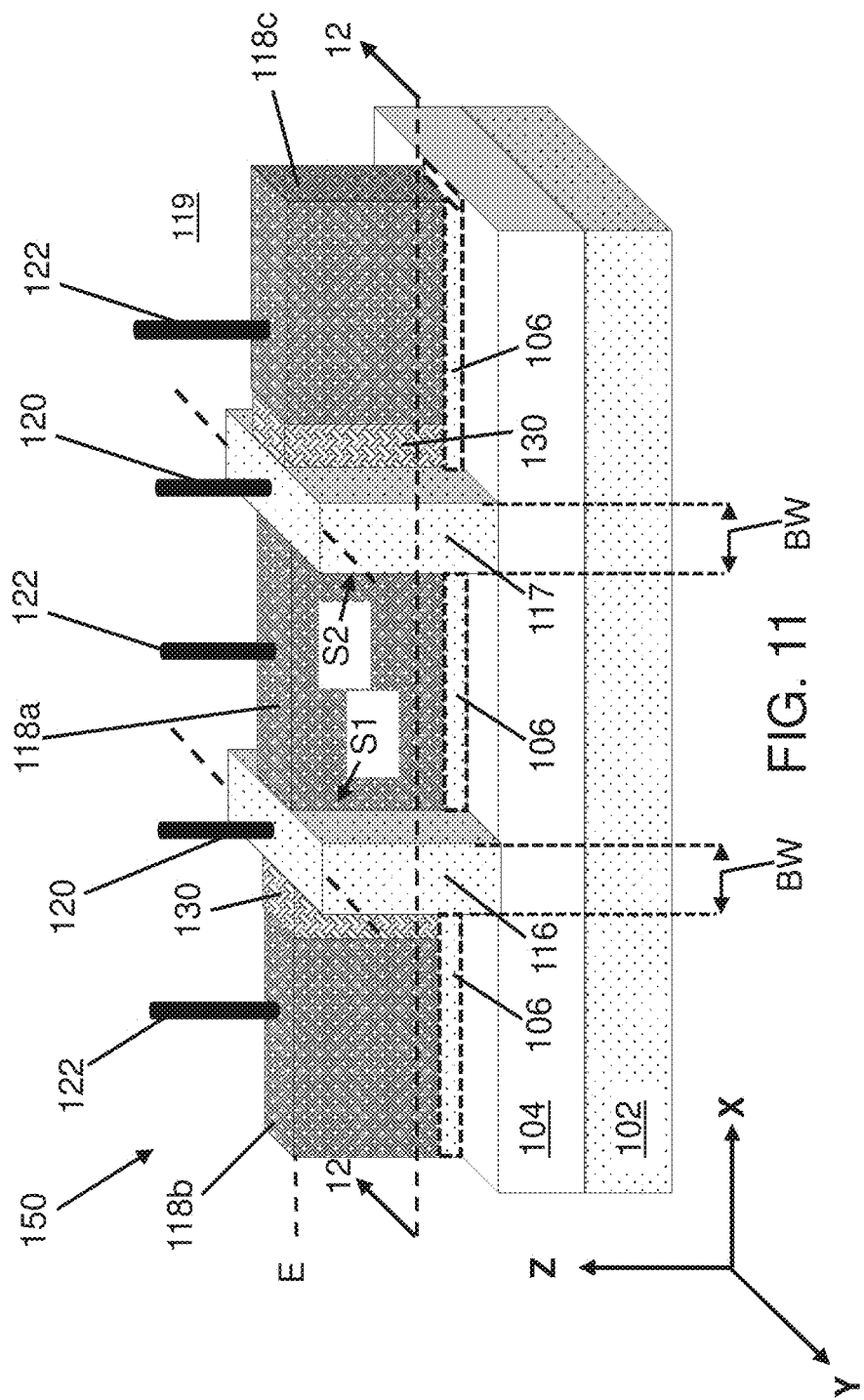
FIG. 11 depicts a perspective view of a bipolar transistor structure with varyingly doped portions according to further embodiments of the disclosure.
Figure 12:
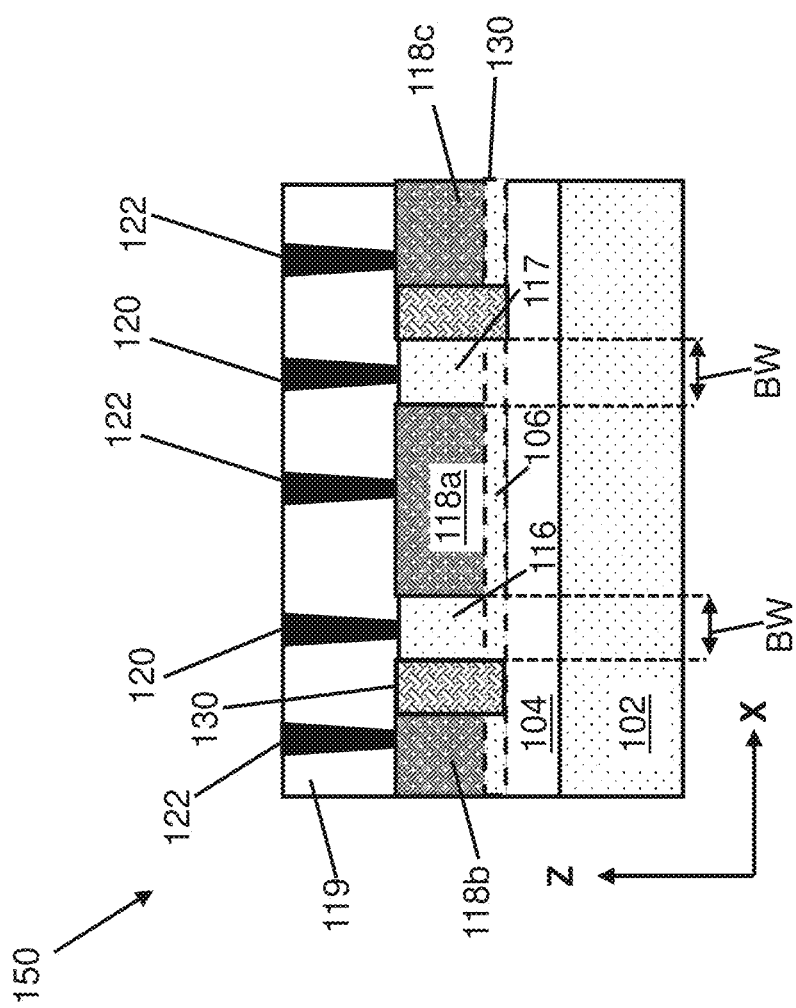
FIG. 12 depicts a cross-sectional view of a bipolar transistor structure with multiple bases and varyingly doped portions according to embodiments of the disclosure.

FIGS. 11 and 12 depict perspective and cross-sectional views, respectively, of bipolar transistor structure 150 according to further implementations. The cross-sectional view in FIG. 12 is taken via view line 12-12 of FIG. 11. Optionally, embodiments of the disclosure may include further doping of E/C material(s) 118b, 118c before isolation layer 119 is formed. According to one example, second and/or third E/C material(s) 118b, 118c may initially have a uniform and low amount of doping throughout their lateral surface areas. Before isolation layer 119 is formed, portions of bipolar transistor structure 150 may be temporarily covered, e.g., by a mask (not shown), to cover first E/C material 118a, first base 116, second base 117, and selected portions of E/C materials 118b, 118c. As with other embodiments discussed herein, SOI layer 106 may or may not be present on buried insulator layer 104. Thus, SOI layer 106 is illustrated with dashed lines in FIGS. 11 and 12.

Additional dopants then may be introduced into the non-covered portions of E/C materials 118b, 118c to produce highly doped (and thus more conductive) regions within second E/C material 118b and third E/C material 118c. The remaining, less highly doped areas of E/C materials 118b, 118c may define lightly doped portions 130 within second E/C materials 118b, 118c. Lightly doped portions 130 may be located, e.g., adjacent first base 116 or second base 117, where applicable. The position of lightly doped portions 130 may improve P-N junction behavior between each base 116, 117 and its corresponding adjacent E/C material 118b, 118c, while also providing stronger electrical conductivity at the interface between E/C material(s) 118b, 118c and E/C contacts 122 thereto. Although not specifically shown in FIGS. 8 and 9, it is also possible to vary the dopant concentration within first base 116 or second base 117 in a similar manner. In some cases, the dopant profile of first base 116 or second base 117 may include distinct intrinsic base or extrinsic base regions. In this case, the portion(s) of first base 116 and/or second base 117 that are adjacent the E/C material(s) 118a, 118b, 118c may be less highly doped. Thus, one or more of bases 116, 117 and/or E/C material(s) 118 in bipolar transistor structure 150 may have a non-uniform dopant concentration. According to an example, highly doped portions of bases 116, 117 and/or E/C materials 118b, 118c may have a dopant concentration on the order of $1.0 \times 10^{19}$ atoms per cubic centimeter (cm$^3$) or above, whereas lightly doped portions 130 and/or less highly doped portions of bases 116, 117 may have a dopant concentration on the order of $1.0 \times 10^{17}$ atoms per cubic centimeter ($cm^3$) or less.

Embodiments of the disclosure provide various technical and commercial advantages, some of which are discussed herein as examples. Embodiments of the disclosure implement bipolar transistor structure 150 in a lateral configuration as a freestanding structure over buried insulator layer 104. The shape and configuration of first base, 116, second base, 117, and E/C materials 118a, 118b, 118c allow each base 116, 117 to have a smaller width than other base structures for lateral bipolar transistors, while retaining a larger lateral surface area than any of E/C materials 118a, 118b, 118c in certain configurations. These and other properties of bipolar transistor structure 150 offer superior current gain as compared to conventional bipolar transistors. Moreover, embodiments of the disclosure allow first E/C material 118a to be structurally integrated into two bipolar transistors through first base 116 and second base 117. Bipolar transistor structure 150 may include one operational bipolar transistor through first E/C material 118a, first base 116, and second E/C material 118b. Bipolar transistor structure 150 also may provide a second bipolar transistor through first E/C material 118a, second base 117, and third E/C material 118c. Bipolar transistor 150 may be fabricated via processes similar to other types of freestanding devices (e.g., FinFET transistors). Bipolar transistor structure 150 thus may require fewer processing modifications to be formed in a single device structure, as compared to other lateral bipolar transistors.

The method and structure as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a center processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A bipolar transistor structure comprising:
a first emitter/collector (E/C) material above an insulator, the first E/C material having a first sidewall and a second sidewall over the insulator;
a first base on the insulator adjacent the first sidewall of the first E/C material;
a second base above the insulator adjacent the second sidewall of the first E/C material;
a second E/C material above the insulator and adjacent the first base, wherein a width of the first base between the first E/C material and the second E/C material is less than a width of the first E/C material, and the first base protrudes horizontally outward from an end of the first E/C material and an end of the second E/C material; and
a semiconductor layer between the first E/C material and the insulator and between the second E/C material and the insulator.

2. The bipolar transistor structure of claim 1, further comprising a third E/C material above the insulator and including a sidewall adjacent the second base.

3. The bipolar transistor structure of claim 1, wherein the first E/C material is horizontally between the first base and the second base.

4. The bipolar transistor structure of claim 1, wherein a combined width of the first base and the second base is less than the width of the first E/C material.

5. The bipolar transistor structure of claim 1, further comprising an isolation region surrounding each of the first E/C material, the first base, the second base, the second E/C material, and the semiconductor layer.

6. The bipolar transistor structure of claim 1, wherein each of the first base and the second base have a lateral surface area that is greater than a lateral surface area of the first E/C material, and wherein the lateral surface area of each of the first base and the second base is greater than a lateral surface area of the second E/C material.

7. The bipolar transistor structure of claim 1, wherein the second E/C material has a non-uniform dopant concentration, and wherein the semiconductor layer is doped.

8. A bipolar transistor structure comprising:
   a first emitter/collector (E/C) material above an insulator, the first E/C material having a first sidewall over the insulator and a second sidewall opposite the first sidewall and over the insulator;
   a first base above the insulator adjacent the first sidewall of the first E/C material;
   a second base above the insulator adjacent the second sidewall of the first E/C material;
   a second E/C material above the insulator and adjacent the first base, wherein a width of the first base between the first E/C material and the second E/C material is less than a width of the first E/C material, wherein the first base protrudes horizontally outward from an end of the first E/C material and an end of the second E/C material;
   a third E/C material above the insulator and adjacent the second base, wherein a width of the second base between the first E/C material and the third E/C material is less than a width of the first E/C material, and the second base protrudes horizontally outward from an end of the first E/C material and an end of the third E/C material; and
   a semiconductor-on-insulator (SOI) layer between each the first E/C material, the second E/C material, and third E/C material and the insulator.

9. The bipolar transistor structure of claim 8, wherein first E/C material, the first base, and the second base are horizontally between the second E/C material and the third E/C material.

10. The bipolar transistor structure of claim 8, wherein a combined width of the first base and the second base is less than the width of the first E/C material.

11. The bipolar transistor structure of claim 8, further comprising an isolation region surrounding each of the first E/C material, the first base, the second base, the second E/C material, the SOI layer, and the third E/C material.

12. The bipolar transistor structure of claim 8, wherein each of the first base and the second base have a lateral surface area that is greater than a lateral surface area of the first E/C material, wherein the lateral surface area of each of the first base and the second base is greater than a lateral surface area of the second E/C material, and wherein the lateral surface area of each of the first base and the second base is greater than a lateral surface area of the third E/C material.

13. The bipolar transistor structure of claim 8, wherein one of the second E/C material and the third E/C material has a non-uniform dopant concentration, and wherein the SOI layer is doped.

14. A method of forming a bipolar transistor structure, the method comprising:
   forming a first emitter/collector (E/C) material above an insulator, the first E/C material having a first sidewall and a second sidewall over the insulator;
   forming a first base above the insulator adjacent the first sidewall of the first E/C material;
   forming a second base above the insulator adjacent the second sidewall of the first E/C material; and
   forming a second E/C material above the insulator and adjacent the first base, wherein a width of the first base between the first E/C material and the second E/C material is less than a width of the first E/C material, and the first base protrudes horizontally outward from an end of the first E/C material and an end of the second E/C material,
   wherein a semiconductor layer is between the first E/C material and the insulator and between the second E/C material and the insulator.

15. The method of claim 14, further comprising forming a third E/C material above the insulator and adjacent the second base.

16. The method of claim 14, further comprising forming an isolation region that surrounds each of the first E/C material, the first base, the second base, the second E/C material, and the semiconductor layer.

17. The method of claim 14, wherein forming the first base and forming the second base causes the first E/C material to be horizontally between the first base and the second base.

18. The method of claim 14, wherein forming the first base, the first E/C material, and the second base causes a combined width of the first base and the second base to be less than the width of the first E/C material.

19. The method of claim 14, wherein each of the first base and the second base have a lateral surface area that is greater than a lateral surface area of the first E/C material, and wherein the lateral surface area of each of the first base and the second base is greater than a lateral surface area of the second E/C material.

20. The method of claim 14, further comprising:
   doping a first portion of the second E/C material adjacent the first base to have a first dopant concentration; and
   doping a second portion of the second E/C material adjacent the first portion to have a second dopant concentration greater than the first dopant concentration.

* * * * *